(12) United States Patent
Lien et al.

(10) Patent No.: US 11,894,081 B2
(45) Date of Patent: Feb. 6, 2024

(54) EP CYCLING DEPENDENT ASYMMETRIC/SYMMETRIC VPASS CONVERSION IN NON-VOLATILE MEMORY STRUCTURES

(71) Applicant: SanDisk Technologies LLC, Addison, TX (US)

(72) Inventors: Yu-Chung Lien, San Jose, CA (US); Xue Bai Pitner, Sunnyvale, CA (US); Ken Oowada, Fujisawa (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 65 days.

(21) Appl. No.: 17/685,113

(22) Filed: Mar. 2, 2022

(65) Prior Publication Data
US 2023/0282295 A1    Sep. 7, 2023

(51) Int. Cl.
*G11C 16/34* (2006.01)
*G11C 16/10* (2006.01)
*G11C 16/04* (2006.01)
*G11C 16/08* (2006.01)
*G11C 16/26* (2006.01)

(52) U.S. Cl.
CPC ...... *G11C 16/3495* (2013.01); *G11C 16/0433* (2013.01); *G11C 16/08* (2013.01); *G11C 16/102* (2013.01); *G11C 16/26* (2013.01)

(58) Field of Classification Search
CPC . G11C 16/3495; G11C 16/0433; G11C 16/08; G11C 16/102; G11C 16/26
See application file for complete search history.

(56) References Cited

U.S. PATENT DOCUMENTS

| 10,510,413 | B1 * | 12/2019 | Diep | G11C 16/3459 |
| 2014/0192594 | A1 * | 7/2014 | Lue | G11C 16/10 365/185.11 |
| 2015/0170746 | A1 * | 6/2015 | Oowada | G11C 16/10 365/185.18 |
| 2020/0393973 | A1 * | 12/2020 | Reusswig | G06F 12/0246 |

* cited by examiner

*Primary Examiner* — Donald H B Braswell
(74) *Attorney, Agent, or Firm* — Dickinson Wright PLLC

(57) ABSTRACT

A method for programming a target memory cell of a memory array of a non-volatile memory system, the method comprises determining a total number of erase/programming (EP) cycles that were applied previously to the memory cell and, (1) if the determined total number of cycles does not exceed a threshold value, applying an asymmetric programming scheme, and, (2) if the determined total number of cycles exceeds the threshold value, applying a symmetric programming scheme. Further, a magnitude of a boosting voltage bias (VPASS) that is to be applied to an unselected word line may be determined according to the determined total number of erase/programming (EP) cycles.

17 Claims, 14 Drawing Sheets

| Number of EP Cycles Applied (Number of Cycles) | Word Line Voltage Bias Applied to WLn-1 (Volts) |
|---|---|
| First Cycle | $V_0$ |
| 1st Threshold Value | $V_0 + 1*(x) = V_1$ |
| 2nd Threshold Value | $V_0 + 2*(x) = V_2$ |
| 3rd Threshold Value | $V_0 + 3*(x) = V_3$ |
| 4th Threshold Value | $V_0 + 4*(x) = V_4$ |
| 5th Threshold Value | $V_0 + 5*(x) = V_5$ |
| 6th Threshold Value | $V_0 + 6*(x) = V_6$ |
| ⋮ | ⋮ |
| "N"th Threshold Value | $V_0 + ("N")*(x) = V_N$ |

| Number of EP Cycles Applied (Number of Cycles) | Word Line Voltage Bias Applied to WLn-1 (Volts) |
|---|---|
| First Cycle | $V_0$ |
| 1st Threshold Value | $V_1$, wherein $V_1 \geq V_0$ |
| 2nd Threshold Value | $V_2$, wherein $V_2 \geq V_1$ |
| 3rd Threshold Value | $V_3$, wherein $V_3 \geq V_2$ |
| 4th Threshold Value | $V_4$, wherein $V_4 \geq V_3$ |
| 5th Threshold Value | $V_5$, wherein $V_5 \geq V_4$ |
| 6th Threshold Value | $V_6$, wherein $V_6 \geq V_5$ |
| ⋮ | ⋮ |
| "N"th Threshold Value | $V_N$, wherein $V_N \geq V_{N-1}$ |

_FIG. 15_

EP CYCLING DEPENDENT ASYMMETRIC/SYMMETRIC VPASS CONVERSION IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for, during a programming operation, applying a combined asymmetric VPASS and symmetric VPASS scheme that is dependent upon the aggregate number of erase/programming (EP) cycles experienced by the subject non-volatile memory device.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein a threshold voltage ($V_{th}$) of the memory cell transistor is controlled by and dependent upon the amount of charge that is retained on the transistor's floating gate. Specifically, in a switch-like manner, a minimum amount of voltage that must be applied to the control gate of the transistor before the transistor is activated to permit conduction between its source and drain regions is, therefore, determined by the level of charge being retained on the floating gate. As a result, bit-value data can be programmed onto and erased from the cell by precisely changing the level of charge on the floating gate in order to change the threshold voltage ($V_{th}$) characteristic of the transistor. In an array structure, the memory cells are addressable by word lines (rows) and bit lines (columns). One type of non-volatile memory storage defined by this general structure is referred to as NAND flash memory based upon its electrical characteristics, which resemble a NAND logic gate.

As explained in detail below, the number of bits that can be stored in an individual memory cell is dependent upon the number of distinct voltage ranges that may be partitioned within the threshold voltage ($V_{th}$) window of that memory cell. For example, to store one bit of data (referred to as a binary data), the possible threshold voltage ($V_{th}$) of a memory cell can be divided into two voltage ranges, wherein the ranges are assigned as logical data "1" and "0" respectively. Accordingly, a memory cell of this storage density order may be referred to as a "single-level cell" or SLC.

By further partitioning the threshold voltage ($V_{th}$) window of a memory cell into additional distinct voltage ranges, multiple levels of information may be stored. A memory cell of this storage density order may be referred to as a "multi-state cell" or MLC. For example, in order to store two bits of data, the threshold voltage ($V_{th}$) window of a cell can be further partitioned into four distinct voltage ranges, with each range assigned a bit value equal to, for example, "11," "10," "01," and "00." Accordingly, following an erase operation, the cell's threshold voltage ($V_{th}$) is negative, which could be defined as logic "11." As such, the positive threshold voltages ($V_{th}$) can be used for the programmed states of "10," "01," and "00." In a further example, to store three bits of data, the threshold voltage ($V_{th}$) window of a cell may be partitioned into eight distinct voltage ranges, with each range assigned a bit value equal to, for example, "111," "110," "100," "010," "011," "000," "001," and "101." A memory cell of this storage density order may be referred to as a "tri-level," "triple-level cell," or TLC. In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

The specific relationship between the data programmed into a memory cell and the threshold voltage ($V_{th}$) levels of the memory cell depends on the data encoding pattern or data scheme adopted for the memory cells.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure. As described in greater detail below, the lack of separation between the charge trapping regions of the memory cells in these three-dimensional array structures provide further challenges with respect to the reliability and retention of the programmed data.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in an increased number of manufacturing, memory operation, and performance errors. For example, due to the electrical/physical behavior and, under certain circumstances, the mobile nature of electrons that are retained at the floating gate or charge trapping layer of programmed memory cells, electron interference as a result of, for example, electrical fringing effects or electrostatic coupling, can occur between neighboring memory elements following a programming operation, thereby problematically skewing the threshold voltage ($V_{th}$) distribution of a memory cell. Also, as time elapses, a programmed memory cell may experience a lateral shifting in the threshold voltage ($V_{th}$) distributions of its programmed charge states as the retained electrons diffuse from the memory cell, which degrades the data retention of the programmed data.

To compensate for these types of disturbances or inaccuracies, various algorithmic methods exist for identifying, filtering and/or correcting noise and bit errors during the read operation and subsequent processing. However, these existing measure add complexity and latencies to the memory operations. In addition, these methods lose their overall efficacy as the subject memory device becomes heavily cycled. Accordingly, there is a particular need for mitigation mechanisms that can address these performance challenges at the initial point of a programming operation.

SUMMARY

Various embodiments include a method for programming a target memory cell of a memory array of a non-volatile memory system. The method comprises determining a total number of erase/programming (EP) cycles that were applied previously to the memory cell and, (1) if the determined total number of cycles does not exceed a threshold value, applying an asymmetric programming scheme, and, (2) if the determined total number of cycles exceeds the threshold value, applying a symmetric programming scheme.

Other embodiments include a non-volatile memory system, comprising a memory array storing data in a target memory cell and a memory controller coupled to the memory array, the memory controller determining a total number of erase/programming (EP) cycles applied previously to the memory cell and, (1) if the determined total number of cycles does not exceed a threshold value, applying an asymmetric programming scheme, and, (2) if the determined total number of cycles exceeds the threshold value, applying a symmetric programming scheme.

Additional embodiments include a method for programming a target memory cell of a memory array of a non-volatile memory system. The method comprises determining (1) a total number of erase/programming (EP) cycles that were applied previously to the memory cell, and (2) based upon the determined total number of cycles, determining a magnitude of a boosting voltage bias (VPASS) to be applied to an unselected word line.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 14 is a lookup table that may be applied in the memory programming operation depicted in FIG. 13, in accordance with an exemplary embodiment; and FIG. 15 is a lookup table that may be applied in the memory programming operation depicted in FIG. 13, in accordance with another exemplary embodiment.

DETAILED DESCRIPTION

Figure 1:
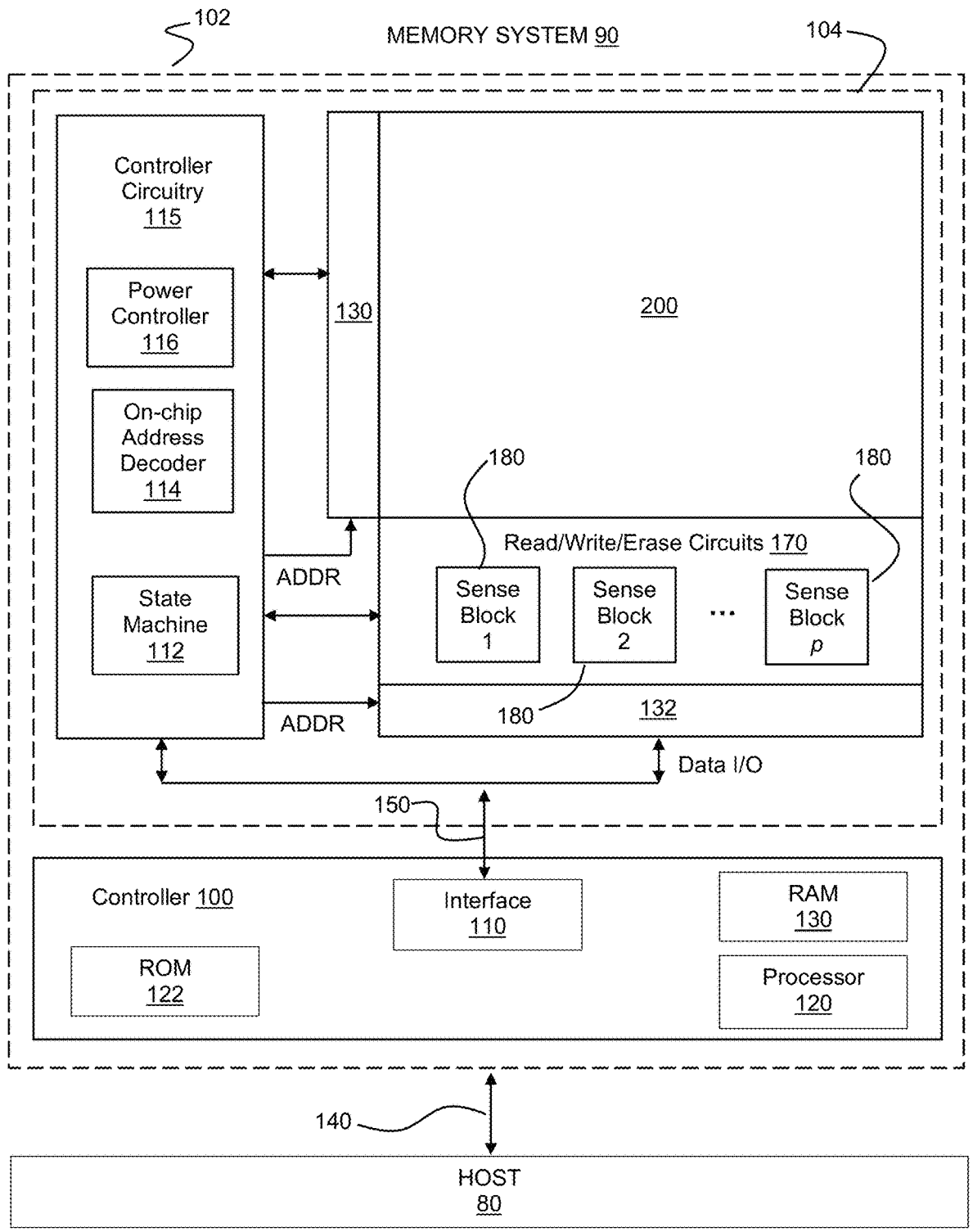
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
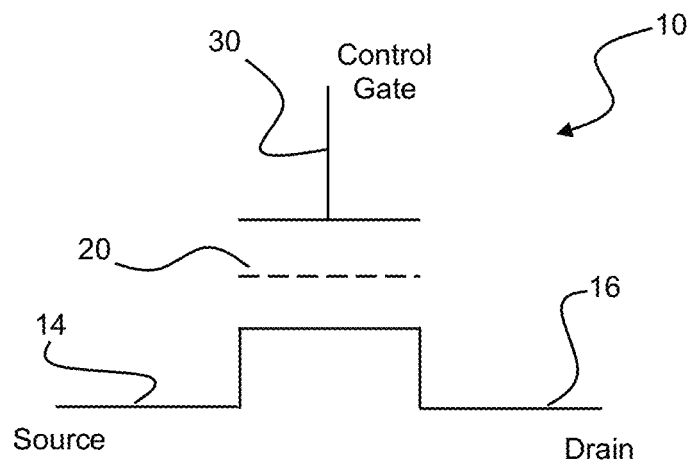
FIG. 2 schematically depicts a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3:
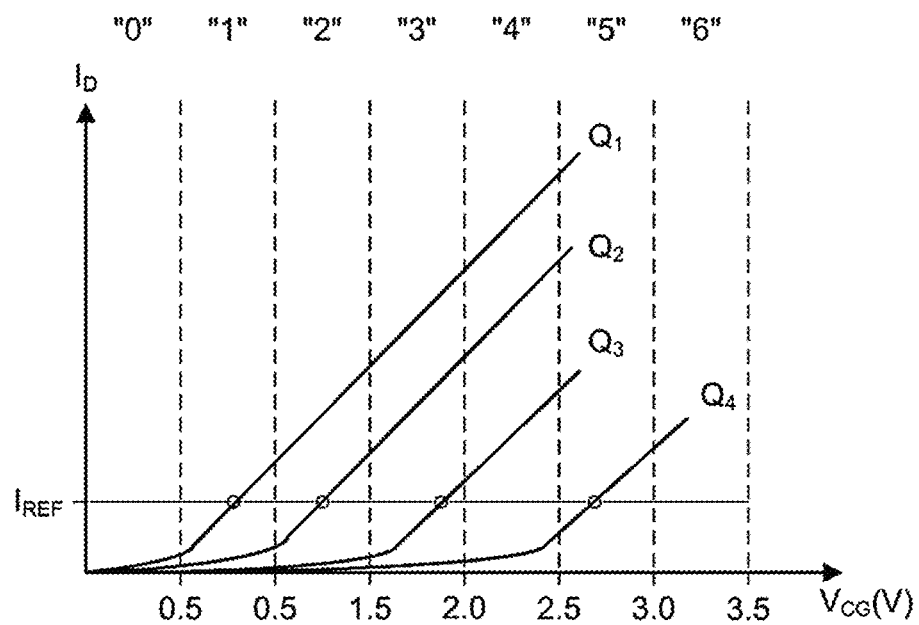
FIG. 3 depicts the relationship between a source-drain current ID and a control gate voltage $V_{CG}$ for four different charges Q1-Q4 that a floating gate of a non-volatile memory cell may be selectively storing at any one time at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels (or states) that can be programmed onto a floating gate of the memory cell, wherein the four charge levels respectively correspond to four of eight possible memory states. Therefore, as an example, the threshold voltage ($V_{th}$) window of a population of memory cells may range from 0.5 V to 3.5 V. In such an example, seven programmed memory states assigned as "0," "1," "2," "3," "4," "5," and "6," respectively, and one erased state (not shown in FIG. 3), may be demarcated by partitioning the threshold voltage ($V_{th}$) window into regions at intervals of 0.5 V each. Accordingly, if a reference current IREF, of 2 µA is used as depicted, then a memory cell that is programmed with Q1 voltage may be considered to be in a memory state "1" as its curve intersects with IREF in the region of the threshold voltage ($V_{th}$) window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage ($V_{th}$) window. For example, in a memory cell 10 that has a threshold voltage ($V_{th}$) window ranging from −1.5 V to 5 V, thereby providing a possible maximum width (or distribution) of 6.5 V, and is to store 16 memory states, each memory state may only occupy a voltage range of from 200 mV to 300 mV. However, such a narrow voltage range will require higher precision in both the programming and reading operations in order to achieve the required resolution.

Figure 4A:
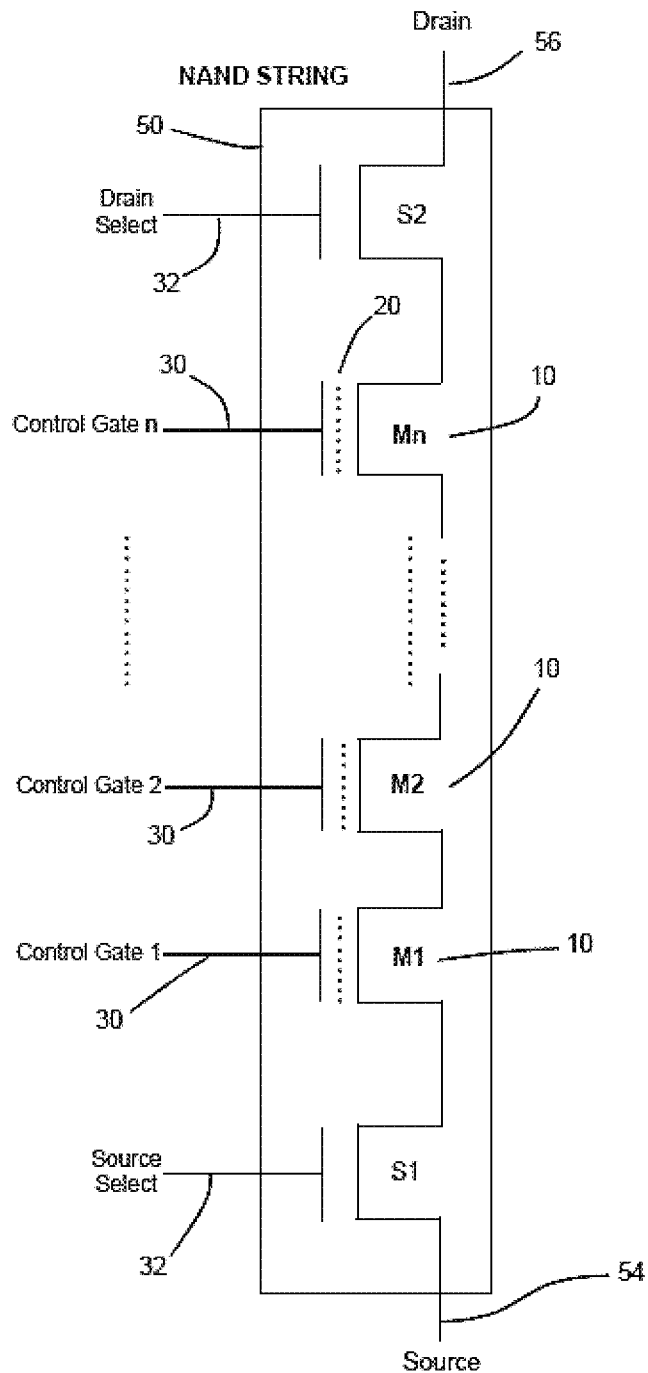
FIG. 4A schematically depicts a series of NAND-type memory cells organized into a string, in accordance with exemplary embodiments.

According to certain exemplary embodiments, the individual memory cells 10 are organized into in which the memory cells are placed in series. For example, depicted in FIG. 4A is an exemplary embodiment of a string 50 comprised of NAND-type memory cells placed in series in which the transistor elements, i.e., M1, M2, Mn (wherein "n" may equal 4, 8, 16, or higher), are daisy-chained with respect to their sources and drains. Further, as discussed above with respect to FIG. 2, each memory transistor 10 in string 50 has a charge storage element 20 (e.g., a floating gate) for storing a certain amount of electron charge therein so as to represent an intended memory state of that cell, wherein each memory transistor 10 comprises a control gate 30 that allows control over the read and the write memory operations. Present at the source terminal 54 and drain terminal 56 of the string 50 are select transistors S1, S2 that control the transistor's connection to the outlaying memory array. Specifically, when the source select transistor 51 is turned on, the source terminal 54 of string 50 is coupled to a source line (SL). Likewise, when the drain select transistor S2 is turned on, the drain terminal 56 of string 50 is coupled to a bit line (BL) of the memory array.

Figure 4B:
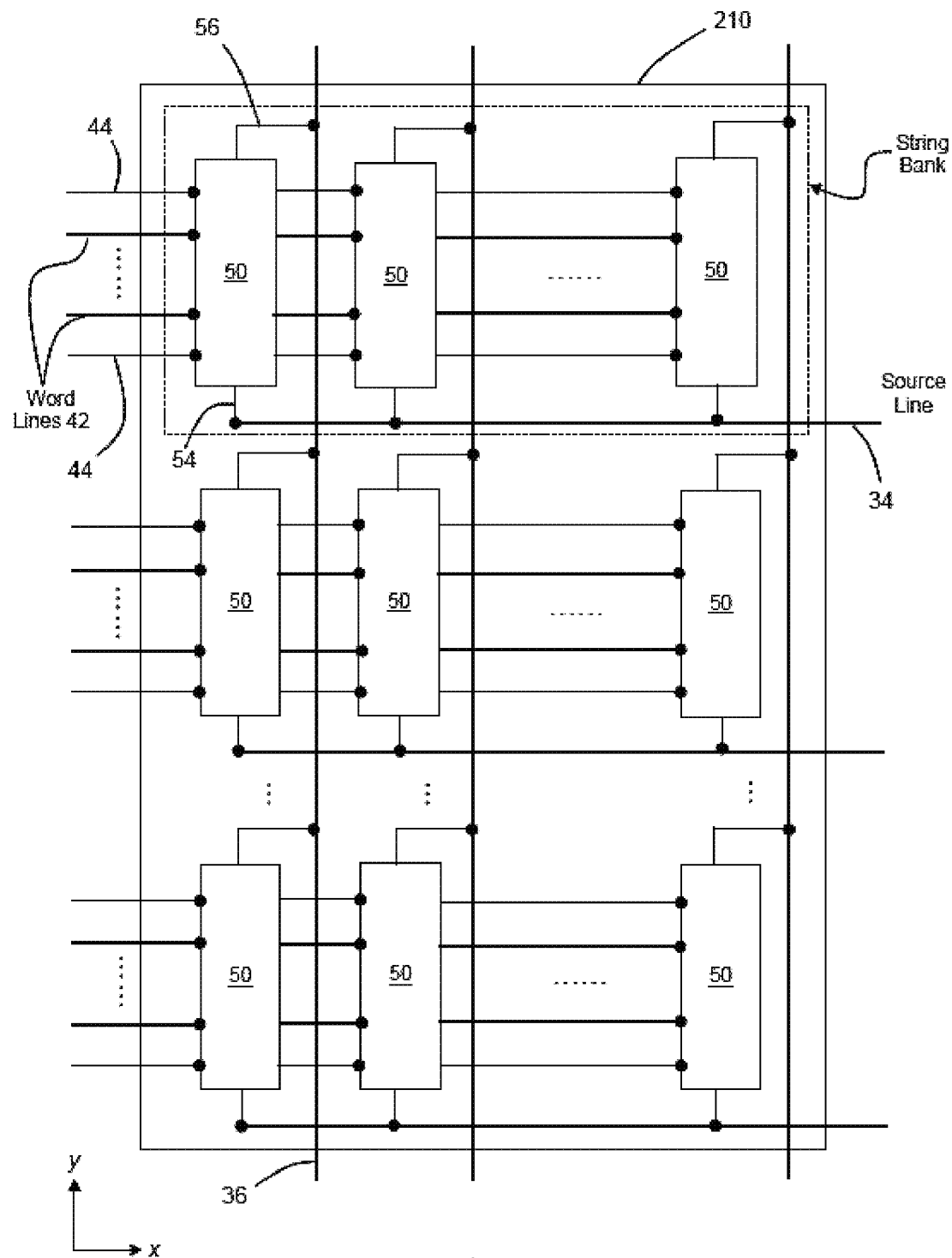
FIG. 4B schematically depicts a two-dimensional array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 200 (such as memory array 210) comprised of a plurality of NAND strings 50 of the type illustrated in FIG. 4A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Figure 5:
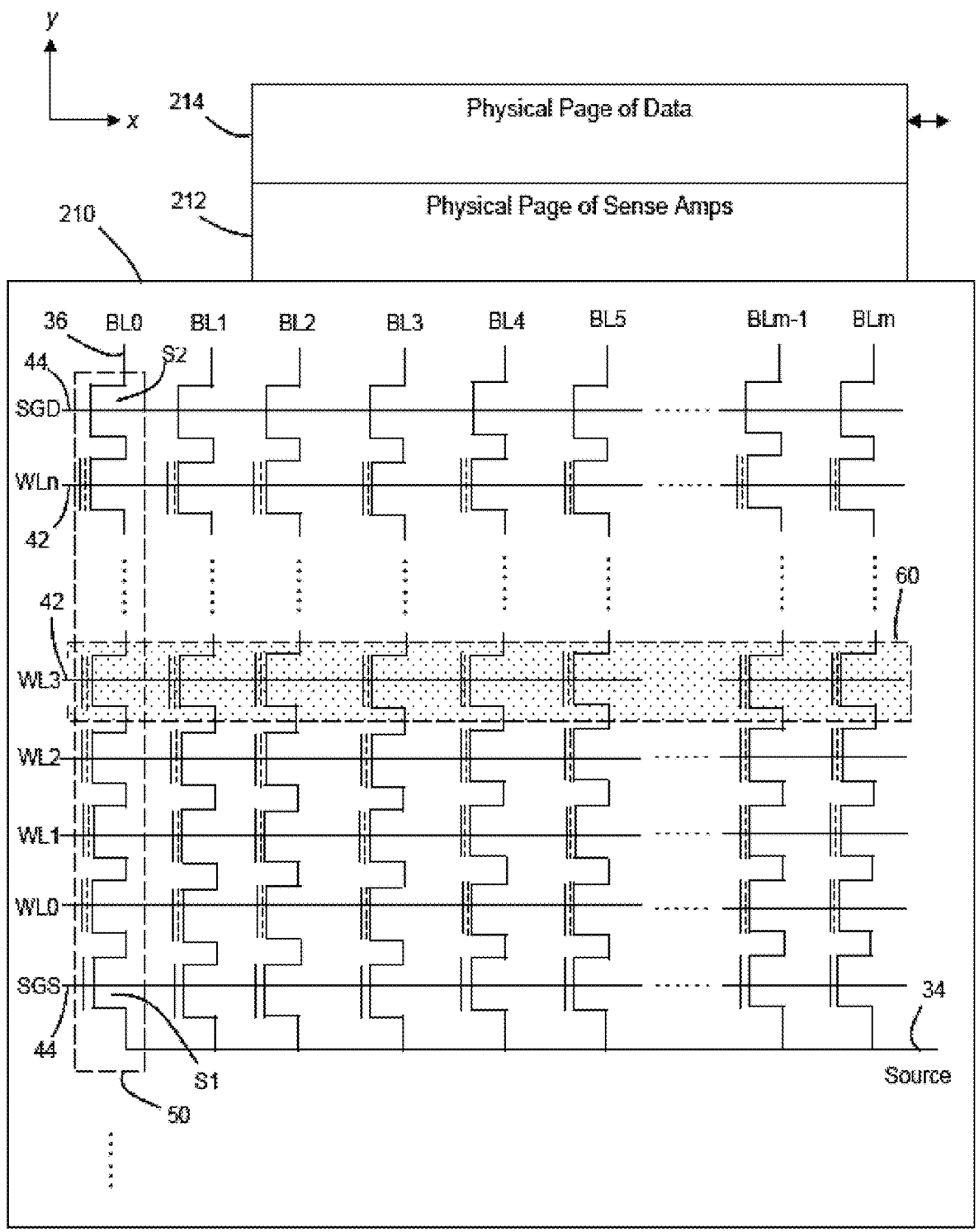
FIG. 5 depicts a page of memory cells being sensed or programmed in parallel, and in relation to a memory array organized in a NAND-type configuration, in accordance with exemplary embodiments.

Referring now to FIG. 5, depicted there is a detailed illustration of a bank of NAND strings 50 of a memory array 210 according to an exemplary embodiment thereof. This view is particularly useful in visualizing a row-by-row configuration of the memory array 210, wherein each row may be referred to as a physical "page." Accordingly, a physical page (e.g., page 60 denoted in FIG. 5) is a group of memory cells 10 that is enabled to be sensed or programmed in parallel. In such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm−1, and BLm, as depicted in FIG. 5). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 6:
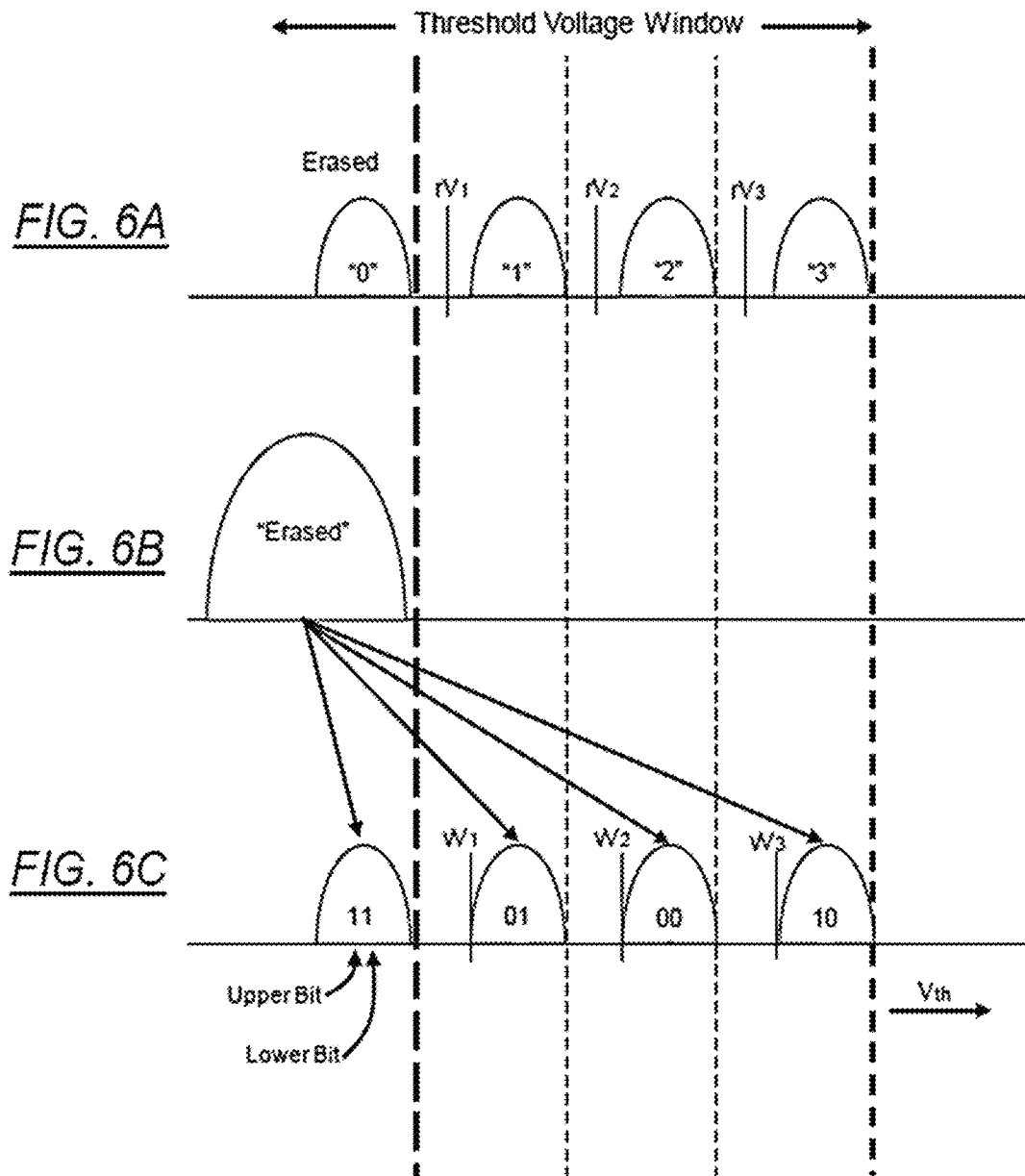
FIG. 6A-C depict stages of programming four states of a population of MLC-type memory cells, in accordance with exemplary embodiments.

To illustrate an exemplary embodiment of the programming stages of, for example, a MLC memory device that is comprised of a population of four-state memory cells, reference is made to FIGS. 6A-C. In FIG. 6A, there is depicted a population of memory cells in which the characteristic threshold voltage ($V_{th}$) window is divided into four distinct voltage distributions, with each distribution corresponding to a programmable memory state (i.e., memory states "0," "1," "2," and "3"). FIG. 6B illustrates an initial distribution of "erased" threshold voltages ($V_{th}$) for an erased memory. In FIG. 6C, much of the memory cell population has been programmed such that the initial "erased" threshold voltage of a given memory cell 10 is moved to a higher value into one of the three divided voltage zones that are demarcated by verify levels $vV_1$, $vV_2$, and $vV_3$. Accordingly, each memory cell can be programmed to one of the three programmable states "1," "2," and "3," or remain in the "erased" state. On a bit level, a two-bit code having, for example, a lower bit and upper bit can be used to represent each of the four memory states. For example, as depicted in FIG. 6C, the memory states "0," "1," "2," and "3" may be assigned bit values "11," "01," "00," and "10" respectively. In such example, the two-bit data may be read from the memory by sensing in a "full-sequence" mode in which the two bits are, for example, sensed together by sensing relative to the corresponding read demarcation threshold voltages—rV1, rV2, and rV3—in three sub-passes respectively.

Figure 7:
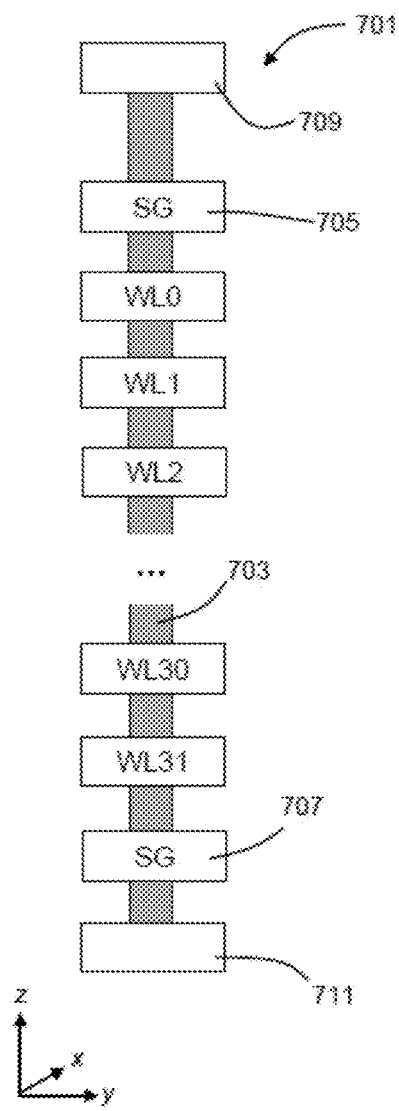
FIG. 7 depicts a vertical NAND-type string of a three-dimensional memory array, in accordance with exemplary embodiments.

In FIGS. 4A-B and 5 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 7 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 7, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 4A-B, 5 and 6, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by the row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 8A:
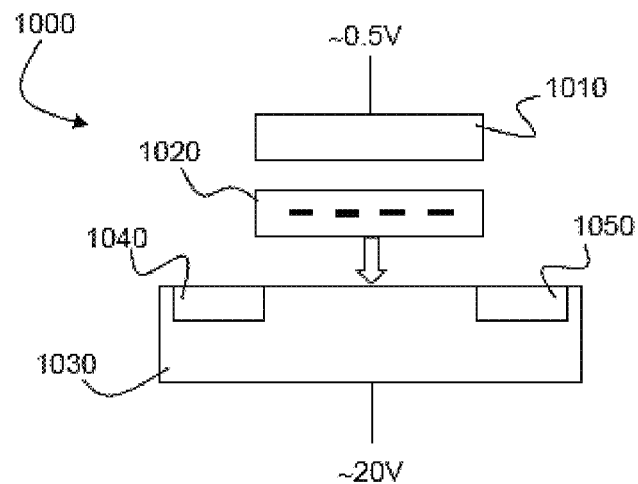
FIG. 8A is a diagrammatic illustration of a memory erase operation with respect to a programmable transistor of a two-dimensional memory structure, in accordance with exemplary embodiments.
Figure 8B:
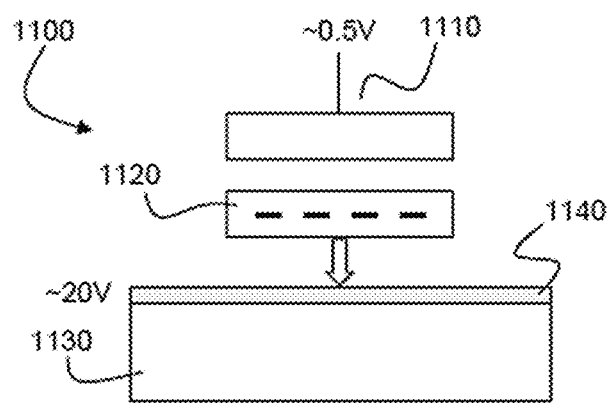
FIG. 8B is a diagrammatic illustration of a memory erase operation with respect to a programmable transistor of a three-dimensional memory structure, in accordance with exemplary embodiments.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate. This process is diagrammatically illustrated in FIG. 8A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to substrate body 1030, causing the electron charges (−) trapped at the floating gate 1020 to be pushed back into substrate 1030. Similarly, depicted in FIG. 8B is a diagrammatic view of a general erase process with respect to a three-dimensional NAND-type memory cell configuration 1100, according to an exemplary embodiment. Here, a relatively low voltage (e.g., ~0.5 V) is applied to the appropriate word line 1110 and a relatively high voltage VERA (e.g., ~20 V) is applied to a channel 1140 of the memory structure 1130, the channel being comprised of holes. As a result, the electron charges (−) are pushed out of the charge trapping layer 1120.

As mentioned above, these high storage density memory structures, such as the types described above, have relatively small spacing between the adjacent memory elements (e.g., memory cells or holes), and each element has a relatively small tolerance between the discrete voltage ranges for memory functions. Accordingly, improving the amount of efficient storage capability within a fixed die size has competing drawbacks and liabilities. As previously mentioned, some challenges arise from electrical phenomena occurring from electron charges being retained on, for example, a charge trapping layer of a three-dimensional NAND-type memory array structure. For example, interference as a result of the electrostatic coupling between, for example, neighboring word lines (WL), may occur. Furthermore, once a memory hole/cell is programmed, the retained electron charges may, over time, physically migrate or diffuse to one or more of the neighboring memory holes or cells based on, for example, an electrical gradient, leading to a lateral shift in the threshold voltage ($V_{th}$) distributions of the programmed charge state(s). Accordingly, any occurrences of electron interference and lateral shifting may significantly compromise the reliability of the programmed data.

Figure 9A:
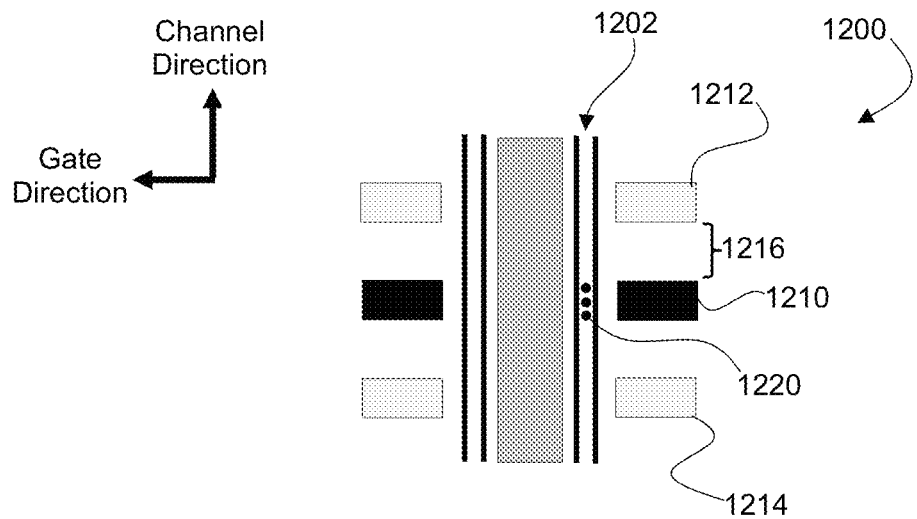
FIG. 9A is a diagrammatic illustration of a memory programming operation of a representative section of a three-dimensional NAND-type memory string, in accordance with exemplary embodiments.
Figure 9B:
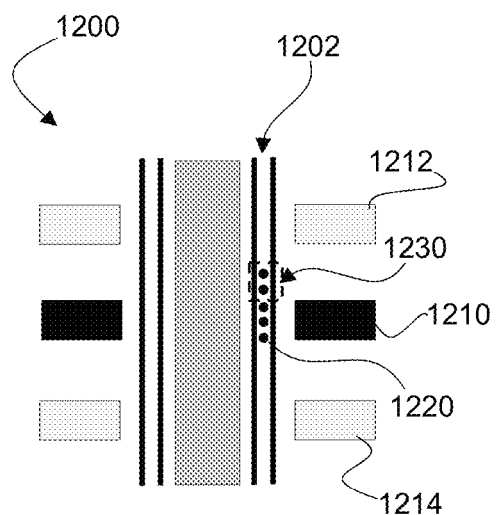
FIG. 9B is a diagrammatic illustration of the presence of excess electron charges at a charge trapping layer of the representative section depicted in FIG. 9A, in accordance with exemplary embodiments.
Figure 9C:
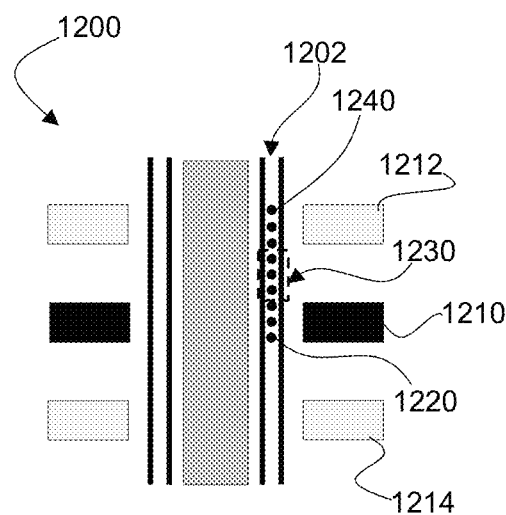
FIG. 9C is a diagrammatic illustration of a neighboring word line interference (NWI) condition with respect to the representative section depicted in FIG. 9A, in accordance with exemplary embodiments.

Referring now to FIGS. 9A-9C, illustrated in a general manner is one example of neighboring word line interference (NWI) that could occur between adjacent word lines in a memory structure as a result of a programming operation. Beginning with FIG. 9A, it depicts a representative section 1200 of a three-dimensional NAND-type memory string (such as the example depicted in FIG. 7) that comprises three word lines (WLs) 1210, 1212, and 1214. As indicated, there is a spatial distance 1216 occurring between the adjacent word lines, which is determined during fabrication. In addition, with respect to this exemplary embodiment, the selected word line (WL), according to this particular programming scheme, is word line 1210. This word line may be referred to as word line "WLn," wherein "n" is any integer. As such, the unselected word lines, i.e., 1212 and 1214, may correspondingly be referred to as word line "WLn+1" and word line "WLn−1," respectively. As described in greater detail above, during programming, a pre-determined voltage bias ($V_{PROG}$) is applied to the selected word line 1210 ("WLn"), thereby resulting in electron charges 1220 being retained at the charge trapping layer 1202.

Figure 10A:
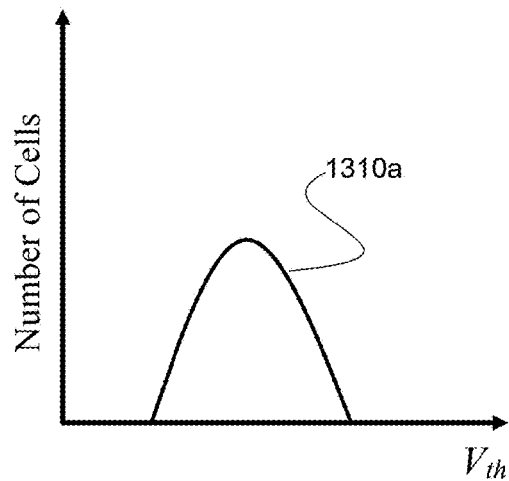
FIG. 10A generally depicts a threshold voltage ($V_{th}$) distribution of a given memory structure, in accordance with exemplary embodiments.
Figure 10B:
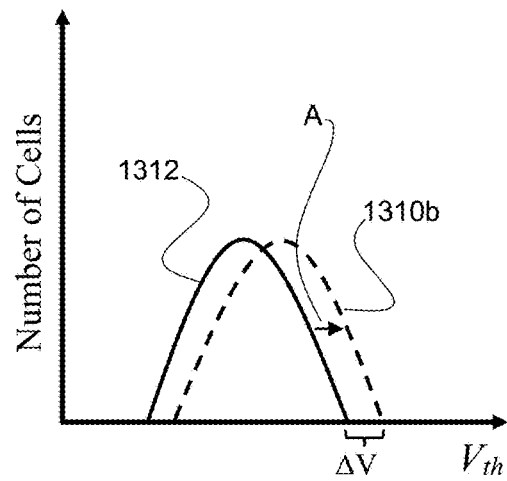
FIG. 10B generally depicts a threshold voltage ($V_{th}$) distribution of a given memory structure as being impacted by the presence of neighboring word line interference (NWI), in accordance with exemplary embodiments.

However, upon data and observation in practice, it may be possible that additional electron charges are unintentionally trapped at the charge trapping layer 1202 due to certain electrical behaviors and interactions as a result of the structure of the memory device and the programming operation. The added electron charges may result in a neighboring word line interference (NWI) phenomenon, thereby effectively skewing the respective threshold voltage ($V_{th}$) distribution(s) of the impacted memory elements. For example, as depicted in FIG. 9B, memory structure 1200 might exhibit additional electron charges 1230 trapped at the charge trapping layer 1202 between the word line spacing 1216 that exists between the adjacent word lines due to an electrical fringing effect. Furthermore, as demonstrated in FIG. 9C, this problematic neighboring word line interference (NWI) phenomena is exacerbated by the subsequent programming. As depicted, according to this particular programming scheme, a voltage bias is then applied to the next-in-line selected word line 1212 (i.e., word line WLn+1). As a result of this applied voltage bias, electron charges 1240 are now retained at the charge trapping layer 1202. Therefore, an excess of electron charges (depicted in FIG. 9C as electron charges 1220, 1230, and 1240) populate the charge trapping layer 1202. FIGS. 10A and 10B provide a general illustration of the consequential impact of excess electron charges to the threshold voltage ($V_{th}$) distribution of the programmed memory holes or cells following the programming steps demonstrated in FIG. 9C. The graphical depiction in FIG. 10A shows the expected threshold voltage ($V_{th}$) distribution of the programmed memory holes or cells upon application of the voltage bias to word line WLn under the circumstances shown in FIG. 9A. Accordingly, in the example in FIG. 10A, no excess electron charges are trapped at the charge trapping layer 1202 and, as such, curve 1310a generally represents the threshold voltage ($V_{th}$) distribution upon application of a pre-determined voltage bias to word line WLn, wherein no neighboring word line interference (NWI) is present. In stark contrast, FIG. 10B graphically depicts, generally speaking, two threshold voltage ($V_{th}$) distribution curves 1310b and 1312, as occurring under the electrical conditions depicted in FIGS. 9B-9C. Specifically, curve 1312 represents the threshold voltage ($V_{th}$) distribution with respect to the word line 1212 (i.e., word line WLn+1), and curve 1310b similarly represents the threshold voltage ($V_{th}$) distribution regarding the word line 1210 (i.e., word line WLn). Accordingly, as signaled by the dotted character of the curve 1310b, there is a marked and observable upshift (referenced as ΔV and in the direction of arrow "A" in FIG. 10B) of the threshold voltage ($V_{th}$) distribution as being experienced by word line 1210 (i.e., word line WLn) as a result of the neighboring word line interference (NWI). Thus, as a detrimental consequence of this upshift (ΔV) in the threshold voltage ($V_{th}$) distribution, the reliability of the programmed data is suspect and effectively degraded.

Figure 11A:
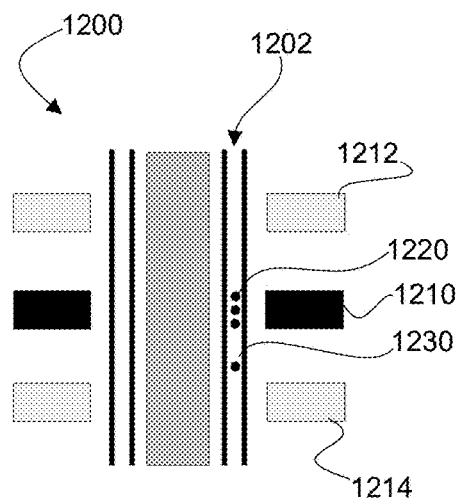
FIG. 11A is a diagrammatic illustration of a memory programming operation of the section depicted in FIG. 9A, in which a symmetric programming scheme is being applied, in accordance with exemplary embodiments.
Figure 11B:
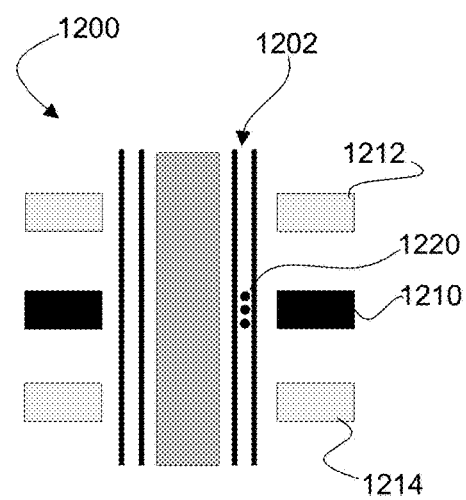
FIG. 11B is a diagrammatic illustration of a memory programming operation of the section depicted in FIG. 9A, in which an asymmetric programming scheme is being applied, in accordance with exemplary embodiments.

Various correction or mitigation mechanisms may be employed to address the neighboring word line interference (NWI) that results from the unintentional excess electron charges being retained at the charge trapping layer. For example, illustrated generally in FIGS. 11A and 11B is an exemplary embodiment of such a mitigation mechanism. For purposes of illustration, FIGS. 11A and 11B depict the mitigation mechanism as applied to the same representative section 1200 of the memory structure that was discussed above with respect to FIGS. 9A-9C. With the aim of illustrating this particular mitigation mechanism by way of comparison, FIG. 11A generally depicts the electrical characteristics or behavior of memory structure 1200 under conditions in which the mitigation mechanism is not utilized and, in juxtaposition, FIG. 11B generally depicts the electrical characteristics or behavior of memory structure 1200 as a result of applying the mitigation mechanism thereto. Specifically, in the instance of FIG. 11A, during a programming operation, a symmetrical boosting voltage bias ("VPASS") scheme is applied to the unselected word lines 1212 and 1214 (i.e., word lines "WLn+1" and "WLn−1," respectively). In other words, the same boosting voltage bias level is applied to both of the unselected word lines 1212 and 1214. As a result, as described in detail above, electron charges 1230 that are in excess of the intended electron charges 1220 may be disruptively retained at charge trapping layer 1202, thereby potentially creating a neighboring word line interference (NWI) issue outside of the word line (WL) border. To mitigate this phenomenon, an asymmetrical boosting voltage bias scheme may instead be applied to the unselected word lines 1212 and 1214 in such a way as to decrease the presence of any excess electron charges at the charge trapping layer 1202. Specifically, rather than apply the same boosting voltage bias (VPASS) level to each of the unselected word lines, differing boosting voltage bias (VPASS) levels may be applied across the unselected word lines. For example, according to the particular embodiment depicted in FIG. 11B, a first boosting voltage bias (VPASS) level (referenced herein as, for example, $V_{gp1}$) may be applied to the unselected word line 1214 (i.e., word line "WLn−1"). Further, a second boosting voltage bias (VPASS) level (referenced herein as, for example, $V_{pass1}$) may similarly be applied to the unselected word line 1212 (i.e., word line "WLn+1"), wherein the first boosting voltage bias level is lower than the second boosting voltage bias level and, additionally, may be lower than the voltage bias level ($V_{PROG}$) applied to the selected word line 1210 (i.e., word line "WLn"). Accordingly, $V_{pass1} > V_{PROG} > V_{gp1}$, wherein the optimal and/or satisfactory voltage bias levels or ranges for $V_{pass1}$, $V_{PROG}$, and $V_{gp1}$, may be determined based upon experimental and in situ data analysis and observations. As a result of this approach, as shown in FIG. 11B, the presence of any excess electron charges at the charge trapping layer 1202 is effectively reduced or eliminated, thereby significantly alleviating the issue of neighboring word line interference (NWI) over successive erase/programming (EP) cycles as previously discussed.

Despite beneficially tackling or mitigating the issue of excess electron charges at the charge trapping layer of a memory device, an asymmetrical boosting voltage (VPASS) bias scheme may, over time, create instabilities in the electrical behavior of the memory device that, when weighed against the data reliability benefits, may no longer be as applicable, germane or relevant once the memory device approaches a relatively heavy-cycled or near end-of-life condition. For example, by reducing the population of electron charges at the charge trapping layer, applying an asymmetric boosting voltage bias (VPASS) scheme across unselected word lines may create empty electron holes that, over a period of time, due to the resulting electrical gradient, could cause electron charges to laterally migrate or diffuse between adjacent memory elements (i.e., memory cells or holes) within the memory device. Thus, this lateral movement may, over time, result in a lateral shift in the programmed threshold voltage ($V_{th}$) distributions, thereby causing a significant loss in data retention. Therefore, while the asymmetric boosting voltage bias scheme may provide a vast improvement to the cycle degradation that may be otherwise experienced, a symmetric boosting voltage approach may be a better safeguard with respect to data retention in the longer term. Given this understanding, it may be beneficial to utilize a hybrid boosting voltage bias approach that is dependent upon the number of erase/programming cycles, thereby leveraging the advantages of either the asymmetric or the symmetric boosting voltage bias scheme at various points in time during the lifetime of the memory device when each scheme is most useful. Thus, the process flow diagram in FIG. 12 illustrates such a hybrid boosting voltage bias approach in accordance with one exemplary embodiment.

Figure 12:
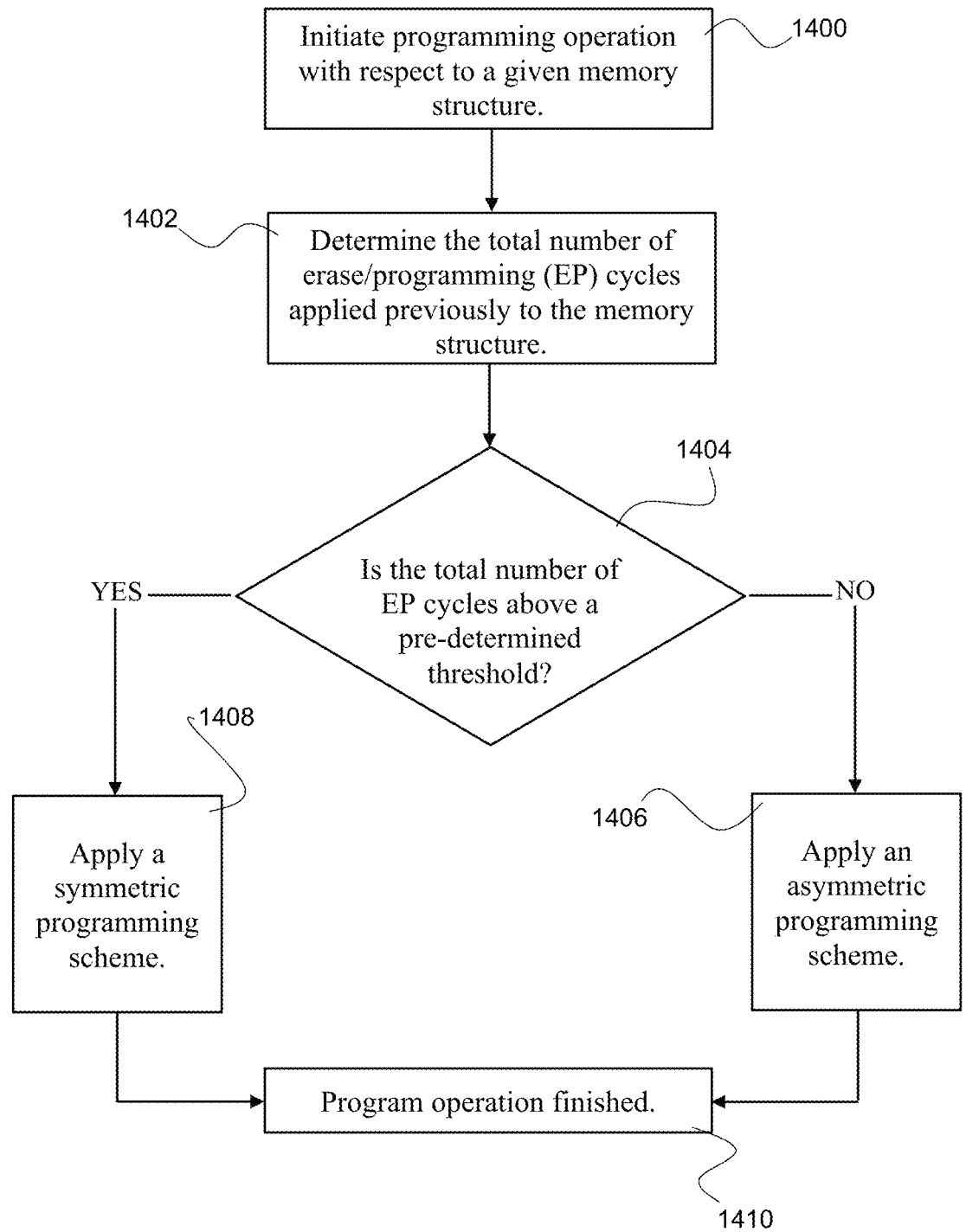
FIG. 12 is a flow diagram generally illustrating the steps of a memory programming operation, in accordance an exemplary embodiment.

Beginning at step 1400 of the process set forth in FIG. 12, a programming memory operation is initiated with respect to a given memory structure. As a preliminary step, the total number of erase/programming (EP) cycles applied previously to the memory structure is ascertained (see step 1402) using one or more counting or clocking mechanisms internal to the memory structure. Next, in step 1404, it is determined whether the ascertained total number of erase/programming (EP) cycles exceeds a pre-determined threshold number. Such a threshold number may be pre-determined according to data and observations gathered and made experimentally and in situ with respect to a given memory structure (either individually or by like/similar type), wherein the pre-determined threshold number may be the number of erase/programming cycles that is indicative of a near (or at) end-of-life condition of the given memory structure, or is indicative of when a data retention parameter of the given memory structure falls, or is likely to fall, outside of a certain performance standard. In addition, this threshold number may be pre-determined at the time of manufacture, or may be dynamically determined, either consistently or periodically, throughout the complete life of the memory structure.

Continuing at step 1406, if the cycle count does not exceed the threshold number, an asymmetric programming scheme may be applied to the memory structure such that differing boosting voltage bias (VPASS) levels are applied to the unselected word lines (such as was described above in connection with FIG. 11B). Thereafter, the programming operation is completed (see step 1410).

If however, at step 1404 in FIG. 12, the determination is made that the ascertained erase/programming cycle count (referring again to step 1402) exceeds the threshold number, a symmetric programming scheme is instead applied to the memory structure, wherein the same boosting voltage bias (VPASS) level is applied to the unselected word lines (as was described above in connection with FIG. 11A). Thereafter, at step 1410, the programming operation is completed.

Accordingly, this hybrid approach in which an asymmetric programming scheme is applied at the outset of a life of a memory structure and, once the life of the memory structure reaches a certain erase/programming cycle count in which the beneficial reduction in the cycle degradation of the memory structure becomes less germane or applicable, a transition to a symmetric programming scheme is then made, takes an astute and resourceful advantage of the competing benefits and drawbacks between the asymmetric programming approach versus the symmetric programming approach.

Figure 13:
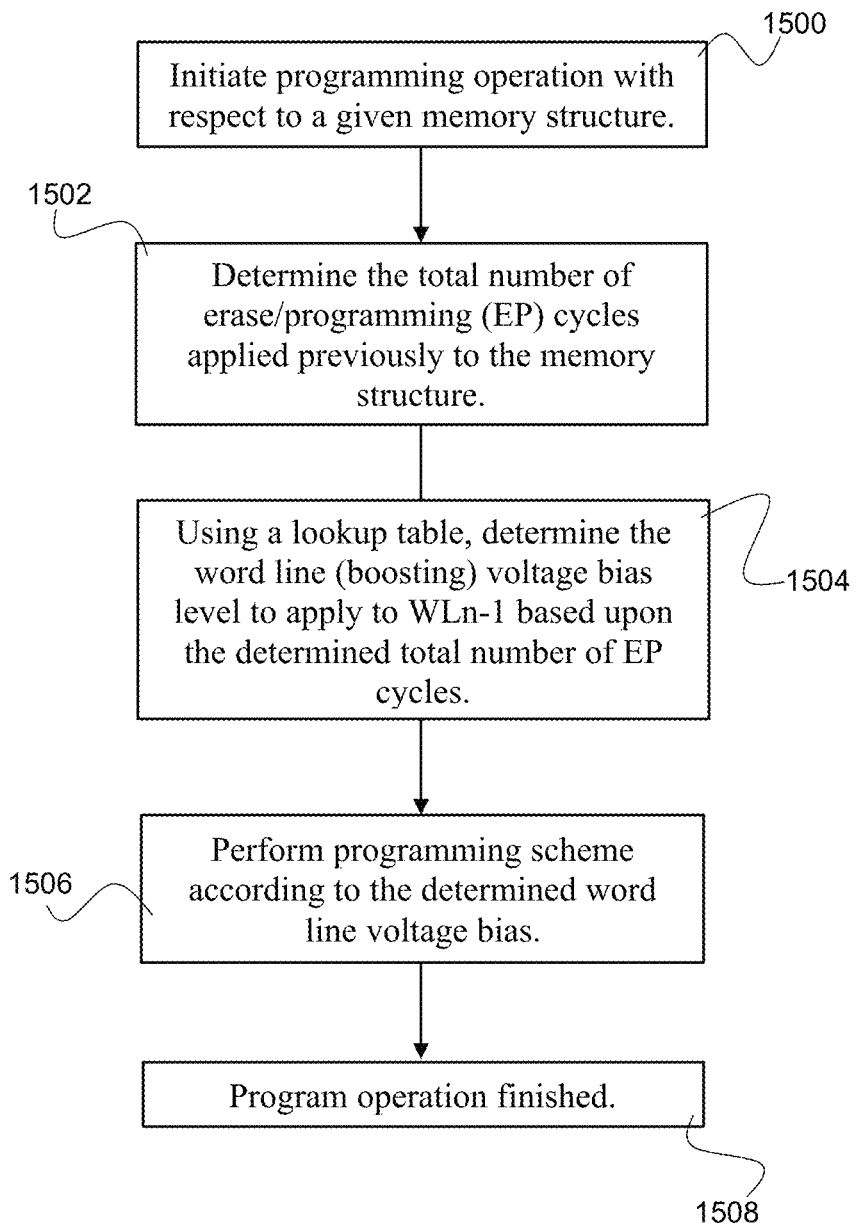
FIG. 13 is a flow diagram generally illustrating the steps of a memory programming operation, in accordance with another exemplary embodiment.

Referring now to the flow diagram set forth in FIG. 13, there is depicted another exemplary embodiment of a process for programming a given memory structure, wherein the process also aims to utilize an asymmetric programming approach in such a way that, as the memory structure approaches a relatively high erase/programming (EP) cycle count, a shift is made to using a symmetric programming approach in order to slow the data retention loss that could result from using the asymmetric programming approach.

However, in contrast to the exemplary embodiment that is depicted in FIG. 12, the process or framework that is generally outlined in FIG. 13 does not entail making a single wholesale switch from an asymmetric programming scheme to a symmetric programming scheme once the erase/programming (EP) cycle count exceeds a pre-determined threshold cycle number. Rather, in this particular embodiment, the programming approach is incremental in which the boosting voltage bias (VPASS) level that is applied to the prior programmed, now unselected, word line (WL) of a memory structure (e.g. word line 1214 or "WLn-1" shown in FIGS. 9A-9C and 11A-11B) is gradually increased over time (e.g., in a stepwise manner), with each increase occurring at a specified total erase/programming (EP) cycle count number. Therefore, as the EP cycle count ratchets up, the boosting voltage bias (VPASS) level being applied to the prior programmed, unselected word line begins at a voltage level that is less than the programming voltage bias (VPROG) level and the boosting voltage bias (VPASS) level being applied to the remaining unselected word lines (e.g., word line 1212 or "WLn+1" of FIGS. 9A-9C and 11A-11B) and incrementally approaches, over one or more intermediate voltage increases, the same boosting voltage bias (VPASS) level that is being applied to the remaining unselected word lines. Therefore, according to this particular exemplary embodiment, the transition to a symmetric programming scheme is not performed in one fell swoop with a single action. Instead, the transition is made in more than one phase.

Accordingly, as generally set forth in FIG. 13, this particular embodiment, following initiation of a programming operation with respect to a given memory structure (see step 1500 thereof), begins by determining the total number of erase/programming (EP) cycles applied previously to the memory structure (see step 1502). Thereafter, in step 1504, the word line (WL) voltage bias (i.e., the boosting voltage bias (VPASS)) level to be applied to the last prior programmed and now unselected word line (i.e., word line "WLn-1," wherein the selected word line is word line "WLn") is determined based upon the ascertained total EP cycle count and according to a lookup table stored internally within the memory device. Next, at step 1506, the programming operation is performed according to the word line voltage bias level that was determined at step 1504. Thereafter, at step 1508, the programming operation is completed. Accordingly, depending upon the specific content of the lookup table used, this particular embodiment provides a process in which the applied boosting voltage bias (VPASS) may, in perhaps a relatively more precise or delicate manner, be gradually increased over a series of intermediate voltage levels over the life of the memory device. Non-limiting exemplary embodiments of a lookup table that may be utilized in the procedure outlined in FIG. 13 are depicted in FIGS. 14 and 15. However, for purposes of the procedure outlined in FIG. 13, the lookup table may take on a variety of forms and the correlating threshold EP cycle count and boosting voltage bias (VPASS) levels may be uniform to all memory devices or derived with respect to a specific memory device.

First with respect to FIG. 14, there is depicted one possible example of a lookup table 1600. As depicted, lookup table 1600 indicates, at each of a series of "N" successive erase/programming (EP) cycle threshold values (wherein "N" is any integer), a corresponding word line or boosting voltage bias (VPASS) level to be applied to word line "WLn-1." More specifically, according to this particular embodiment, lookup table 1600 is designed to, at each specified EP cycle threshold value, incrementally step up or increase the word line or boosting voltage bias (VPASS) level by the same pre-determined voltage amount "x." Accordingly, the first entry of lookup table 1600 begins with the first EP cycle applied to the given memory structure, which corresponds to an initial or starting boosting voltage bias (VPASS) level (referenced herein as "$V_0$" volts) to be applied to word line "WLn-1." Thereafter, proceeding through the lookup table 1600, several successive threshold values with respect to the EP cycle count are specifically listed (referenced as "1st Threshold Value, "2nd Threshold Value," "3rd Threshold Value,"..., "Nth Threshold Value"), with each threshold value then correlated to an increase of the initial or starting boosting voltage bias (VPASS) level "$V_0$" by a corresponding factor of "x" volts.

With respect to FIG. 15, there is depicted another exemplary embodiment of a lookup table 1700 that could be utilized according to the procedure set forth in FIG. 13. In a similar manner to the lookup table 1600 shown in FIG. 14, lookup table 1700 comprises a list of one or more successive threshold EP cycle count values (e.g., a "1st Threshold Value, "2nd Threshold Value," "3rd Threshold Value,"..., "Nth Threshold Value"), wherein each threshold value corresponds to a word line or boosting voltage bias (VPASS) level to be applied to word line "WLn-1." However, in contrast to lookup table 1600, each intermediate boosting voltage bias level is not constrained in magnitude apart from being either equal to, or greater than, the magnitude of the last preceding voltage level. Therefore, at each interval, it is not required that the boosting voltage bias level increase from the last preceding voltage level by a uniform increment (as in the case of lookup table 1600). Rather, it may be increased by any suitable amount. Further, at any given interval, there could be no increase to the boosting voltage bias level whatsoever.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and the physical principles of the devices described. As such, it is intended that the following claims be interpreted to embrace all such variations and modifications.

What is claimed is:

1. A method for programming a target memory cell of a memory array of a non-volatile memory system, comprising:
   determining a total number of erase/programming (EP) cycles applied previously to the target memory cell;
   comparing the total number of erase/programming (EP) cycles to a threshold value; and
   applying an asymmetric programming scheme as a result of determining that the total number of erase/programming (EP) cycles does not exceed a threshold value; and
   applying a symmetric programming scheme as a result of determining that the total number of erase/programming (EP) cycles exceeds the threshold value.

2. The method according to claim 1, wherein the asymmetric programming scheme comprises:
   applying a programming voltage bias to a selected word line with respect to the target memory cell;
   applying a first boosting voltage bias (VPASS) to a first unselected word line; and applying a second boosting voltage bias (VPASS) to a second unselected word line, wherein:
the second unselected word line is a last previously-programmed word line; and
a magnitude of the second boosting voltage bias is less than a magnitude of the programming voltage bias and less than a magnitude of the first boosting voltage bias.

3. The method according to claim 1, wherein the symmetric programming scheme comprises:
applying a programming voltage bias to a selected word line with respect to the target memory cell; and
applying a boosting voltage bias (VPASS) to one or more unselected word lines, wherein the magnitude of the boosting voltage bias is uniform with respect to each of the one or more unselected word lines.

4. The method according to claim 1, wherein the threshold value is:
pre-determined; and
indicative of a near end-of-life condition of the target memory cell.

5. The method according to claim 1, wherein the threshold value is:
pre-determined; and
indicative of a heavily cycled condition of the target memory cell.

6. The method according to claim 1, wherein the memory array is a vertical three-dimensional NAND-type array.

7. A non-volatile memory system, comprising:
a memory array storing data in a target memory cell; and
a memory controller coupled to the memory array and configured to:
determine a total number of erase/programming (EP) cycles applied previously to the target memory cell;
compare the total number of erase/programming (EP) cycles to a threshold value;
apply an asymmetric programming scheme as a result of determining that the total number of erase/programming (EP) cycles do not exceed a threshold value; and
apply a symmetric programming scheme as a result of determining that the total number of erase/programming (EP) cycles exceeds the threshold value.

8. The non-volatile memory system according to claim 7, wherein the asymmetric programming scheme comprises:
applying a programming voltage bias to a selected word line with respect to the target memory cell;
applying a first boosting voltage bias (VPASS) to a first unselected word line; and
applying a second boosting voltage bias (VPASS) to a second unselected word line, wherein:
the second unselected word line is a last previously-programmed word line; and
a magnitude of the second boosting voltage bias is less than a magnitude of the programming voltage bias and less than a magnitude of the first boosting voltage bias.

9. The non-volatile memory system according to claim 7, wherein the symmetric programming scheme comprises:
applying a programming voltage bias to a selected word line with respect to the target memory cell; and
applying a boosting voltage bias (VPASS) to one or more unselected word lines, wherein the magnitude of the boosting voltage bias is uniform with respect to each of the one or more unselected word lines.

10. The non-volatile memory system according to claim 7, wherein the threshold value is:
pre-determined; and
indicative of a near end-of-life condition of the target memory cell.

11. The non-volatile memory system according to claim 7, wherein the threshold value is:
pre-determined; and
indicative of a heavily cycled condition of the target memory cell.

12. The non-volatile memory system according to claim 7, wherein the memory array is a vertical three-dimensional NAND-type array.

13. A method for programming a target memory cell of a memory array of a non-volatile memory system, comprising:
determining a total number of erase/programming (EP) cycles applied previously to the target memory cell;
based upon the determined total number of erase/programming (EP) cycles, determining a magnitude of a boosting voltage bias (VPASS) to be applied to an unselected word linei
wherein the magnitude of the boosting voltage bias (VPASS) is determined using a lookup table stored at the non-volatile memory system;
wherein the lookup table comprises a succession of different benchmark numbers of total erase/programming (EP) cycles;
wherein each benchmark number in turn corresponds to a magnitude of the boosting voltage bias (VPASS); and
wherein the magnitude of the boosting voltage bias (VPASS) corresponding to a specific benchmark number is equal to, or greater than, the magnitude of the boosting voltage bias (VPASS) corresponding to the benchmark number immediately prior to the specific benchmark number in the succession .

14. The method according to claim [[14]] 13, wherein the lookup table comprises a series of different benchmark numbers of total erase/programming (EP) cycles, wherein each benchmark number in turn corresponds to a magnitude of the boosting voltage bias (VPASS).

15. The method according to claim 13, wherein the unselected word line is a last previously-programmed word line.

16. The method according to claim 15, wherein:
the unselected word line is:
a first unselected word line; and
a last previously-programmed word line; and
a magnitude of a boosting voltage bias (VPASS) applied to any unselected word line other than the first unselected word line is unequal to the magnitude of the boosting voltage bias (VPASS) applied to the first unselected word line.

17. The method according to claim 13, wherein the memory array is a vertical three-dimensional NAND-type array.

* * * * *